(12) United States Patent
Netsu et al.

(10) Patent No.: US 9,562,289 B2
(45) Date of Patent: Feb. 7, 2017

(54) CARBON ELECTRODE WITH SLIDABLE CONTACT SURFACES AND APPARATUS FOR MANUFACTURING POLYCRYSTALLINE SILICON ROD

(75) Inventors: Shigeyoshi Netsu, Niigata (JP); Shinichi Kurotani, Niigata (JP); Kyoji Oguro, Niigata (JP); Fumitaka Kume, Niigata (JP); Masaru Hirahara, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 1017 days.

(21) Appl. No.: 13/508,826

(22) PCT Filed: Oct. 22, 2010

(86) PCT No.: PCT/JP2010/006270
§ 371 (c)(1),
(2), (4) Date: May 9, 2012

(87) PCT Pub. No.: WO2011/064940
PCT Pub. Date: Jun. 3, 2011

(65) Prior Publication Data
US 2012/0222619 A1    Sep. 6, 2012

(30) Foreign Application Priority Data
Nov. 26, 2009 (JP) .................. 2009-268429

(51) Int. Cl.
*C30B 28/12* (2006.01)
*C23C 16/458* (2006.01)
(Continued)

(52) U.S. Cl.
CPC .......... *C23C 16/458* (2013.01); *C01B 31/0423* (2013.01); *C01B 33/035* (2013.01); *C23C 16/24* (2013.01)

(58) Field of Classification Search
CPC .......... C30B 25/00; C30B 25/02; C30B 25/12; C30B 28/00; C30B 28/12; C30B 28/14; Y10S 117/00; Y10S 117/911; C23C 16/00; C23C 16/22; C23C 16/24; C23C 16/44; C23C 16/4401; C23C 16/458; C23C 16/4581; Y10T 117/00; Y10T 117/10; Y10T 117/1016; C01B 31/0423; C01B 33/035
(Continued)

(56) References Cited

U.S. PATENT DOCUMENTS 4,828,728 A * 5/1989 Dimigen ................ C23C 16/26
                                                                508/107
5,593,465 A * 1/1997 Seifert .................... C30B 25/12
                                                                118/729
(Continued)

FOREIGN PATENT DOCUMENTS

CN    101570890 A    11/2009
CN    102666380 B     4/2014
(Continued)

OTHER PUBLICATIONS

International Search Report Issued Jan. 25, 2011 in PCT/JP10/006270 Filed Oct. 22, 2010.
(Continued)

*Primary Examiner* — Kenneth A Bratland, Jr.
(74) *Attorney, Agent, or Firm* — Oblon, McClelland, Maier & Neustadt, L.L.P.

(57) ABSTRACT

The upper electrode 31 has a hole 35 extending from an upper surface 33 to a lower surface 34, a bolt 36 is inserted from the upper surface 33 of the upper electrode 31 into the hole 35, and secured in a lower electrode 32 by a screw. A gap 51 between an inside of the hole 35 and a straight body portion of the bolt 36 allows the upper electrode 31 to slide in all directions in a placement surface (upper surface of the
(Continued)

lower electrode 32 in contact with the lower surface 34 of the upper electrode 31 in FIG. 2) that is a contact surface with an upper surface of the lower electrode 32, thereby providing an effect of preventing occurrence of a crack or a break in a U rod that can be expanded and contracted in all directions during a vapor phase growth process.

6 Claims, 4 Drawing Sheets

(51) Int. Cl.
*C01B 33/035* (2006.01)
*C23C 16/24* (2006.01)
*C01B 31/04* (2006.01)

(58) Field of Classification Search
USPC .................. 117/200, 204, 911, 928, 935
See application file for complete search history.

(56) References Cited

U.S. PATENT DOCUMENTS

2009/0241838 A1* 10/2009 Endoh et al. ............... 118/725
2012/0222619 A1   9/2012 Netsu et al.

FOREIGN PATENT DOCUMENTS

| JP | 7-284910 A | 10/1995 |
| JP | 8 45847 | 2/1996 |
| JP | 2004-277223 A | 10/2004 |
| JP | 2006 16243 | 1/2006 |
| JP | 2006-240934 * | 9/2006 |
| JP | 2006 240934 | 9/2006 |
| JP | 2009 221058 | 10/2009 |
| JP | 2009-226705 A | 10/2009 |

OTHER PUBLICATIONS

Combined Office Action and Search Report issued Apr. 30, 2015 in Chinese Patent Application No. 201410092928.7 (with English Translation of Category of Cited Documents).

Extended European Search Report issued Jul. 23, 2015 in Patent Application No. 10832796.6.

* cited by examiner

CARBON ELECTRODE WITH SLIDABLE CONTACT SURFACES AND APPARATUS FOR MANUFACTURING POLYCRYSTALLINE SILICON ROD

TECHNICAL FIELD

The present invention relates to a carbon electrode used for manufacturing polycrystalline silicon, and an apparatus for manufacturing a polycrystalline silicon rod using the carbon electrode.

BACKGROUND ART

A Siemens method is known as a method for manufacturing polycrystalline silicon that is a raw material of monocrystalline silicon for manufacturing semiconductors or silicon for manufacturing solar cells. The Siemens method is a method of bringing a material gas containing chlorosilane into contact with a heated silicon core to grow polycrystalline silicon from vapor phase on a surface of the silicon core using a CVD (Chemical Vapor Deposition) method.

In growing polycrystalline silicon from vapor phase by the Siemens method, two vertical silicon cores and one horizontal silicon core are assembled into an inverted U-shape in a reactor of a vapor phase growth device, and opposite ends of the vertical silicon cores are secured to a pair of metal electrodes placed on a base plate via a pair of core holders.

Next, a current is applied from the metal electrodes to heat the silicon cores to a temperature range of 900° C. to 1200° C. in a hydrogen atmosphere, and a material gas, for example, a mixed gas of trichlorosilane and hydrogen is supplied from a gas nozzle into the reactor. Then, silicon is grown from vapor phase on the silicon core, and a polycrystalline silicon rod having a desired diameter is formed into an inverted U-shape. After the reactor is cooled, the polycrystalline silicon rod is taken out of the reactor.

In recent years, with increasing diameter of a polycrystalline silicon rod, a crack or a break easily occurs in the polycrystalline silicon rod during vapor phase growth or cooling of the polycrystalline silicon rod.

This may be because, in growing a polycrystalline silicon rod by a Siemens method, a temperature difference occurs between a center and a surface in a growing direction (radial direction) of the silicon rod during or after vapor phase growth, and this causes stress by thermal expansion or contraction of the polycrystalline silicon rod.

If the polycrystalline silicon rod breaks and falls in the reactor, heavy metal contamination occurs due to contact with an inner wall of the reactor and metal that constitutes a base plate or a metal electrode, and also it takes time to collect the collapsed polycrystalline silicon rod and clean the base plate to significantly increase an operation cycle time, thereby significantly reducing productivity.

Various proposals have been made to prevent occurrence of such a crack or a break of a polycrystalline silicon rod.

For example, Japanese Patent Laid-Open No. 8-45847 (Patent Literature 1) proposes a mounting tool of a carrier member (core) including at least one spring element provided between a current lead portion (metal electrode) and an electrode holder (holding tool of core holder), wherein the spring element allows movement of the electrode holder with respect to the current lead portion and also absorbs the movement.

Japanese Patent Laid-Open No. 2006-16243 (Patent Literature 2) proposes that a seed holding electrode including a carbon seed holder and a metal electrode, in which the seed holder and the metal electrode are joined by fitting in a tapered shape, and a noble metal sheet is joined therebetween in a rubbing manner, is used to prevent a break of polycrystalline silicon or a carbon component used in the seed holding electrode due to thermal strain generated in a cooling step after production of polycrystalline silicon.

Japanese Patent Laid-Open No. 2006-240934 (Patent Literature 3) proposes that a carbon holder, in which ends of a silicon core are electrically connected to electrodes via conductive holders holding the silicon cores and at least one holder is slidable on an electrode surface both to left and right in a direction of a line connecting opposite ends of an inverted U-shaped silicon core, is used to reduce occurrence of cracks in a polycrystalline silicon rod.

CITATION LIST

Patent Literature

Patent Literature 1: Japanese Patent Laid-Open No. 8-45847

Patent Literature 2: Japanese Patent Laid-Open No. 2006-16243

Patent Literature 3: Japanese Patent Laid-Open No. 2006-240934

SUMMARY OF INVENTION

Technical Problem

As described above, during a vapor phase growth process of polycrystalline silicon by a conventional general Siemens method, opposite ends of an inverted U-shaped silicon core are secured via a pair of core holders to a pair of metal electrodes placed on a base plate. However, if opposite ends of an inverted U-shaped polycrystalline silicon rod (hereinafter simply referred to as "U rod" in some cases) are secured to the metal electrodes, expansion and contraction of the U rod in a horizontal surface direction are inhibited. The expansion and contraction in the horizontal surface direction refer to expansion and contraction, for example, in a direction of a line connecting the opposite ends of the U rod.

The expansion and contraction of the U rod in the horizontal surface direction are not limited to those in the direction of the line connecting the opposite ends of the U rod. For example, if there is a different U rod near an inside of the U rod, radiant heat from the different U rod easily expands the inside. Also, if an outside of the U rod is cooled by a wall of a reactor, the outside is easily contracted. Thus, the U rod can be expanded and contracted in all directions in the horizontal surface direction depending on environments.

However, the mounting tool disclosed in Patent Literature 1 has a complex structure, and does not allow movement of the electrode holder other than in the expansion and contraction directions of the spring element. The seed holding electrode disclosed in Patent Literature 2 is expensive because a noble metal sheet is used in a rubbing manner, and the noble metal is easily incorporated into polycrystalline silicon. Also, the fitting in the tapered shape may cause the seed holder to slide upward along a taper in expansion and be released from the electrode. Further, in the carbon holder disclosed in Patent Literature 3, the polycrystalline silicon rod is slidable only in the direction of the line connecting the opposite ends of the silicon core. Thus, these proposals are insufficient for preventing occurrence of a crack or a break in a polycrystalline silicon rod.

The present invention is achieved in view of such problems, and has an object to provide a technique having a high effect of preventing occurrence of a crack or a break in a U rod that can be expanded and contracted in all directions during a vapor phase growth process of a polycrystalline silicon rod.

Solution to Problem

To achieve the object, the present invention provides a carbon electrode used for manufacturing a polycrystalline silicon rod, including: a lower electrode secured on a metal electrode that is an external electrode for electrifying a silicon core; and an upper electrode placed on the lower electrode, and including a securing portion of a core holder that holds the silicon core on an upper surface side, wherein the upper electrode is slidable in all directions in a placement surface that is a contact surface with an upper surface of the lower electrode.

In the carbon electrode, the upper electrode includes a hole extending from an upper surface to a lower surface, a lower end of a rod-shaped fastening member inserted into the hole is secured to the lower electrode, a diameter of the hole is larger than a diameter of a straight body portion of the rod-shaped fastening member, and a gap is provided between an inside of the hole and the straight body portion.

For example, the diameter of the hole is 1 mm or larger than the diameter of the straight body portion.

The carbon electrode may have a configuration in which the upper electrode is placed on the lower electrode so that a protrusion provided in an upper part of the lower electrode is inserted into a recess provided in a lower part of the upper electrode, an inner size of the recess is larger than an outer size of the protrusion, and a gap is provided between the recess and the protrusion.

The carbon electrode may have a configuration in which the upper electrode is placed on the lower electrode so that a protrusion provided in the lower part of the upper electrode is inserted into a recess provided in the upper part of the lower electrode, an inner size of the recess is larger than an outer size of the protrusion, and a gap is provided between the recess and the protrusion.

For example, the gap between the recess and the protrusion is 1 mm or more.

Preferably, the upper electrode and the lower electrode are made of graphite.

Preferably, a coefficient of static friction of a contact surface between the upper electrode and the lower electrode is 0.3 or less.

The present invention provides an apparatus for manufacturing a polycrystalline silicon rod in which electric power is supplied from a pair of metal electrodes to opposite ends of silicon cores assembled into an inverted U-shape to grow polycrystalline silicon from vapor phase on the silicon core, wherein the both opposite ends of the silicon core assembled into the inverted U-shape are respectively held by securing portions provided in carbon electrodes, and at least one of the carbon electrodes is a type of carbon electrode according to the present invention described above.

Advantageous Effects of Invention

In the carbon electrode of the present invention, for example, the upper electrode is secured to the lower electrode by providing a hole in the upper electrode and inserting the rod-shaped fastening member into the hole, and the gap is provided between the hole and the straight body portion of the fastening member to allow the upper electrode to slide in all directions in a placement surface that is a contact surface with the upper surface of the lower electrode.

This can provide a technique having a high effect of preventing occurrence of a crack or a break in a U rod that can be expanded and contracted in all directions during a vapor phase growth process of a polycrystalline silicon rod.

DESCRIPTION OF EMBODIMENTS

Now, an embodiment of the present invention will be described with reference to the drawings.

Figure 1:
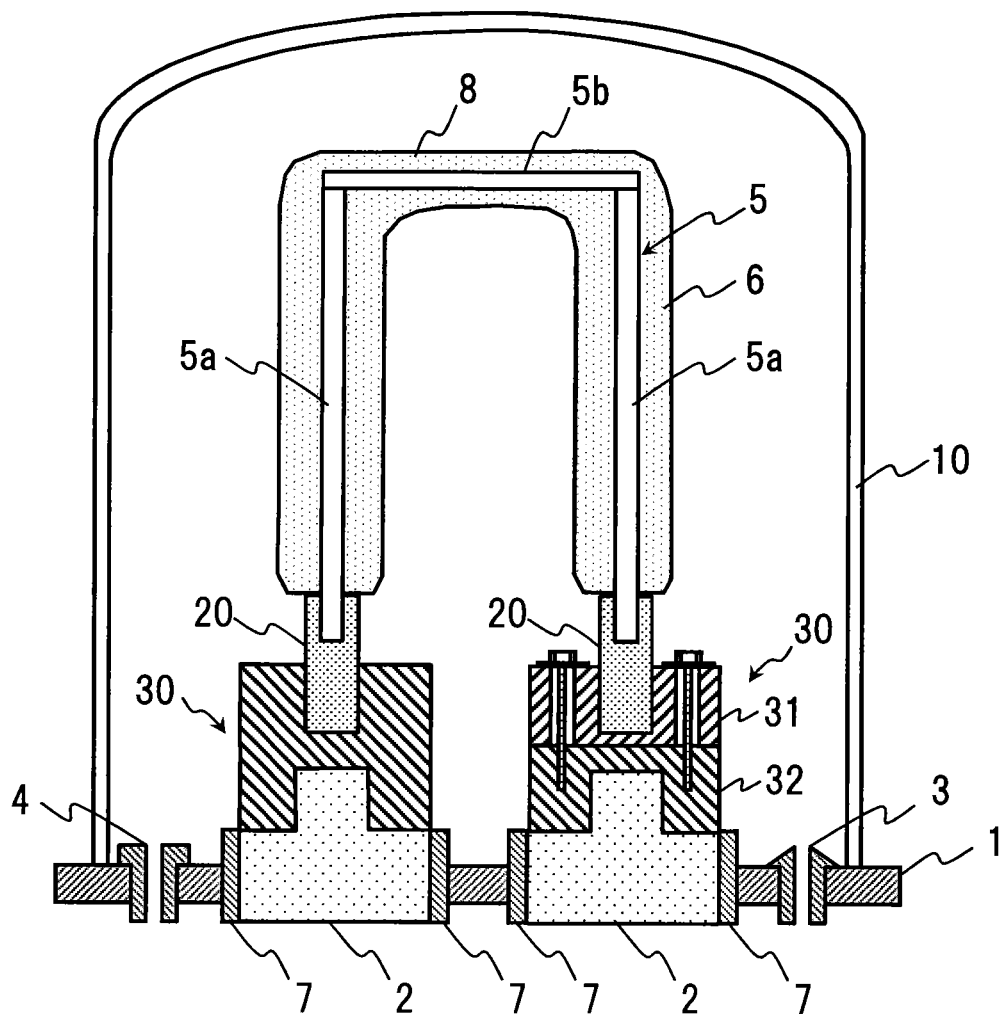
FIG. 1 is a schematic view showing an exemplary configuration of an apparatus for manufacturing a polycrystalline silicon rod of the present invention.

FIG. 1 is a schematic view showing an exemplary configuration of an apparatus 100 for manufacturing a polycrystalline silicon rod of the present invention. The manufacturing apparatus 100 is an apparatus for manufacturing a polycrystalline silicon rod by growing polycrystalline silicon from vapor phase on a surface of a silicon core by a Siemens method, and mainly includes a base plate 1 and a reaction container 10. An obtained polycrystalline silicon rod includes straight body portions 6 that grow from vapor phase on vertical portions 5a of a silicon core 5 assembled into an inverted U-shape, and a bridge portion 8 that grows from vapor phase on a horizontal portion (bridge portion 5b).

On the base plate 1, a metal electrode 2 that supplies a current to the silicon core 5, a gas nozzle 3 that supplies a process gas such as a nitrogen gas, a hydrogen gas, or a trichlorosilane gas, and an exhaust port 4 that exhausts an exhaust gas are placed.

The metal electrode 2 is connected to a different metal electrode (not shown) or a power supply placed outside a reactor, and receives electric power supplied from outside. An insulator 7 is provided on side surfaces of the metal electrode 2, and the metal electrode 2 is held between the insulators 7 and extends through the base plate 1.

As shown in FIG. 1, to grow polycrystalline silicon from vapor phase, two vertical cores (5a) and one horizontal core (5b) are assembled into an inverted U-shape to form the silicon core 5 in the reactor 10, opposite ends of the vertical portions 5a of the silicon core 5 are secured by core holders 20 held by carbon electrodes 30, and external electric power supplied to the metal electrode 2 is applied to the silicon core via the carbon electrodes 30.

The metal electrode 2, the base plate 1, and the reactor 10 are cooled with a refrigerant. The core holder 20 and the carbon electrode 30 are both made of graphite.

At least one of the carbon electrodes 30 is a carbon electrode according to the present invention described later, and is slidable in all directions in a horizontal surface in the drawing.

Figure 2:
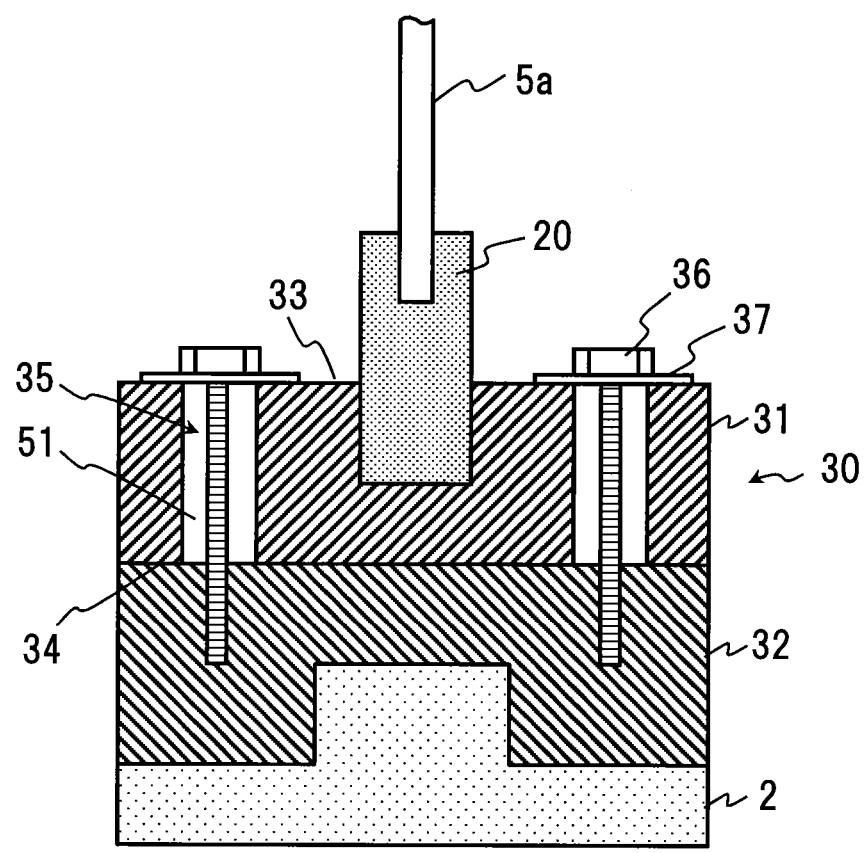
FIG. 2 is a schematic view showing an exemplary configuration of a carbon electrode of the present invention.

FIG. 2 is a schematic view showing an exemplary configuration of the carbon electrode 30 of the present invention. The carbon electrode 30 includes a lower electrode 32 secured on the metal electrode 2 that is an external electrode for electrifying the silicon core 5, and an upper electrode 31 placed on the lower electrode 32. A securing portion of the core holder 20 that holds the silicon core 5a is provided on an upper surface of the upper electrode 31.

The upper electrode 31 has a hole (through hole) 35 extending from an upper surface 33 to a lower surface 34, a bolt 36 that is a rod-shaped fastening member is inserted from the upper surface 33 of the upper electrode 31 through the washer 37 into the hole 35, and secured in the lower electrode 32 by a screw.

As shown in FIG. 2, a diameter of the hole 35 is larger than a diameter of a straight body portion of the bolt 36 so that a gap 51 is created between an inside of the hole 35 and the straight body portion of the bolt 36. The washer 37 has an outer diameter about twice larger than the diameter of the hole 35 to prevent the bolt 36 from entering the hole 35.

The gap 51 between the inside of the hole 35 and the straight body portion of the bolt 36 allows the upper electrode 31 to slide in all directions in a placement surface (upper surface of the lower electrode 32 in contact with the lower surface 34 of the upper electrode 31 in FIG. 2) that is a contact surface with the upper surface of the lower electrode 32, thereby providing an effect of preventing occurrence of a crack or a break in a U rod that can be expanded and contracted in all directions during a vapor phase growth process.

In order to ensure sliding in all directions in the placement surface, the diameter of the hole 35 is preferably 1 mm or larger than the diameter of the straight body portion of the bolt 36. The number of bolts 36 is preferably two or more.

Figure 3:
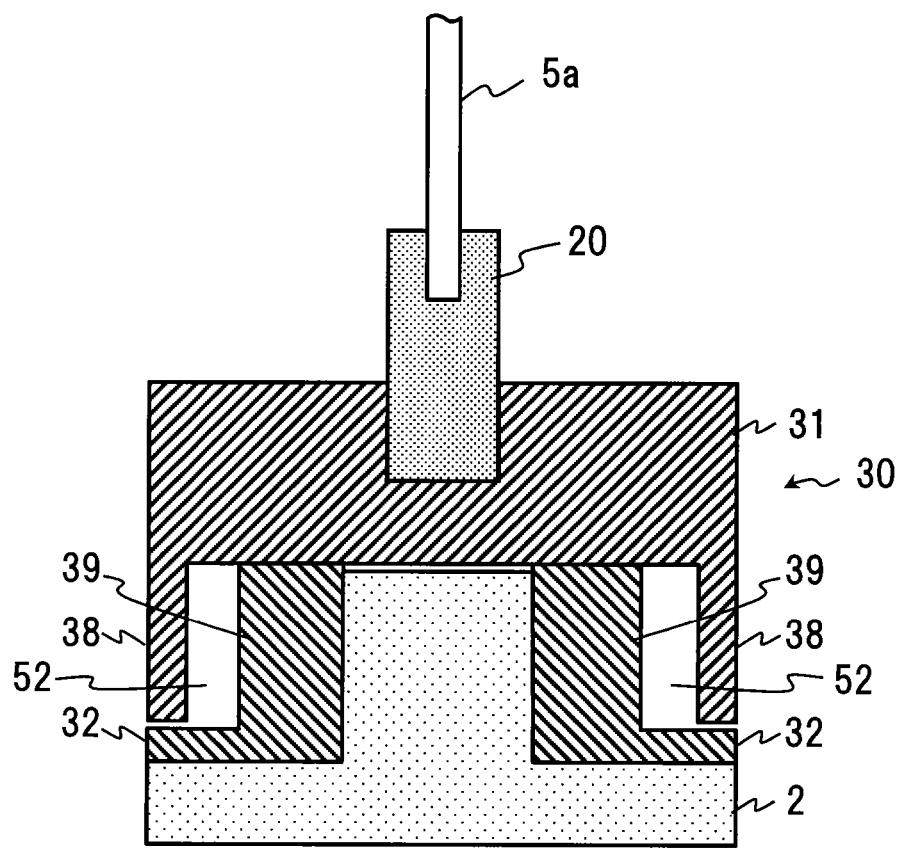
FIG. 3 is a schematic view showing another exemplary configuration of a carbon electrode of the present invention.

FIG. 3 is a schematic view of another exemplary configuration of a carbon electrode 30 of the present invention. In the carbon electrode 30, the upper electrode 31 is placed on the lower electrode 32 so that a protrusion provided in an upper part of the lower electrode 32 is inserted into a recess provided in a lower part of the upper electrode 31.

As shown in FIG. 3, an inner size of a recess 38 of the upper electrode 31 is larger than an outer size of a protrusion 39 of the lower electrode 32, and thus a gap 52 is provided between the recess 38 and the protrusion 39.

The gap 52 between the recess 38 and the protrusion 39 allows the upper electrode 31 to slide in all directions in a placement surface that is a contact surface with an upper surface of the lower electrode 32, thereby providing an effect of preventing occurrence of a crack or a break in a U rod that can be expanded and contracted in all directions during a vapor phase growth process.

In order to ensure sliding in all directions in the placement surface, the gap 52 between the recess 38 and the protrusion 39 is 1 mm or more.

Figure 4:
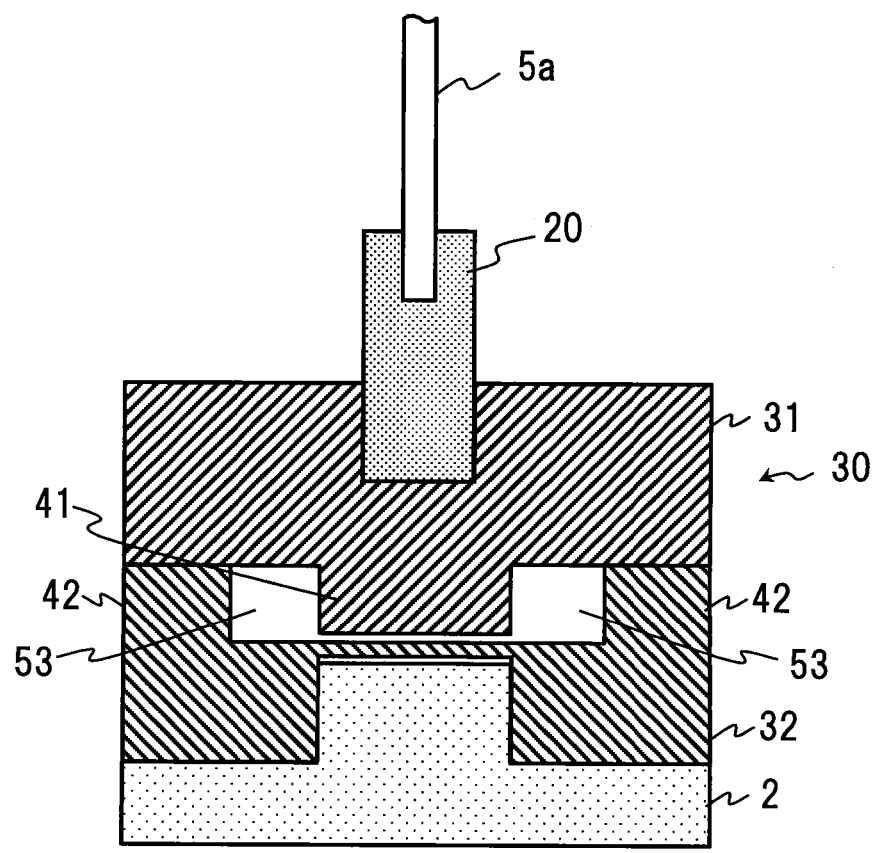
FIG. 4 is a schematic view showing a variant of the carbon electrode shown in FIG. 3.

FIG. 4 is a schematic view showing a variant of the carbon electrode 30 shown in FIG. 3. Specifically, in FIG. 3, the upper electrode 31 is placed on the lower electrode 32 so that the protrusion provided in the upper part of the lower electrode 32 is inserted into the recess provided in the lower part of the upper electrode 31. Meanwhile, an upper electrode 31 is placed on a lower electrode 32 so that a protrusion 41 provided in a lower part of the upper electrode 31 is inserted into a recess 42 provided in an upper part of the lower electrode 32.

Also in this configuration, as shown in FIG. 4, an inner size of the recess 42 of the lower electrode 32 is larger than an outer size of the protrusion 41 of the upper electrode 31, and thus a gap 53 is provided between the recess 42 and the protrusion 41. The gap 53 allows the upper electrode 31 to slide in all directions in a placement surface that is a contact surface with an upper surface of the lower electrode 32. In order to ensure sliding in all directions in the placement surface, the gap 53 between the recess 42 and the protrusion 41 is preferably 1 mm or more.

In FIGS. 3 and 4, the configuration including one set of the protrusion and the recess is described, but multiple sets thereof may be provided. Also in this case, a gap formed between a recess and a protrusion in each set allows an upper electrode to slide in all directions within a range of the gap.

Now, a vapor phase growth process using an apparatus for manufacturing a polycrystalline silicon rod of the present invention will be described.

First, the silicon core 5 is connected to the metal electrode 2, the reaction container 10 is tightly placed on the base plate 1, and a nitrogen gas is supplied from the gas nozzle 3 to replace air in the reaction container 10 with nitrogen. At this time, the air and the nitrogen in the reaction container 10 are exhausted from the exhaust port 4. After the inside of the reaction container 10 is replaced with a nitrogen atmosphere, a hydrogen gas is supplied from the gas nozzle 3 instead of the nitrogen gas to bring the inside of the reaction container 10 into a hydrogen atmosphere.

Then, a heater (not shown) is used to preheat the silicon core 5 to a temperature of 250° C. or more to be conductive so that a current efficiently flows through the silicon core 5. Then, a current is supplied from the metal electrode 2 to the silicon core 5 to heat the silicon core 5 to 900° C. or more. Further, a hydrogen gas and also a trichlorosilane gas are supplied as a material gas to grow polycrystalline silicon from vapor phase on the silicon core 5 within a temperature range of 900° C. to 1200° C. An unreacted gas and a by-product gas are exhausted from the exhaust port 4.

If the temperature is increased to grow polycrystalline silicon from vapor phase on the silicon core 5, the bridge portion 5b of the silicon core 5 stretches due to expansion, and the vapor phase growth of polycrystalline silicon advances in that state. With increasing diameters of the straight body portions 6 and the bridge portion 8 of the polycrystalline silicon rod, temperature distribution is formed in a diametrical direction of the portions.

For the straight body portions 6 of the polycrystalline silicon rod, for example, facing surfaces of the pair of straight body portions 6 that form a U rod radiationally heat each other and expand, and the core holder 20 and the upper electrode 31 are moved in a direction to increase space therebetween. An outside of the U rod is cooled by the reaction container 10 and is lower in temperature than an inside of the U rod, and the core holder 20 and the upper electrode 31 are moved in a direction to warp the U rod outward.

After the straight body portion 6 and the bridge portion 8 of the polycrystalline silicon rod grow to desired diameters, supply of a material gas and supply of a current are stopped in this order, and then the temperature in the reaction container 10 is reduced. At this time, for the U rod with the space increased during growth, the core holder 20 and the upper electrode 31 are moved in a direction to reduce space of the bridge portion 8. For the U rod with a lower temperature on the outside during growth, the core holder 20 and the upper electrode 31 are moved toward a center of the reaction container 10.

In order to smoothly move the upper electrode 31 on the lower electrode 32, a carbon electrode having low friction of a surface contact portion between the upper electrode 31 and the lower electrode 32 needs to be used. From the inventors' diligent study, it has been found that a carbon electrode having a coefficient of static friction of 0.3 or less of a surface contact portion between the upper electrode 31 and the lower electrode 32 allows the upper electrode 31 to smoothly move on the lower electrode 32.

Example 1

As shown in FIG. 1, a silicon core 5 is assembled into an inverted U-shape in a reactor 10, and opposite ends of the inverted U-shaped silicon core 5 are secured to a pair of metal electrodes 2 placed on a base plate 1 via a pair of core holders 20 and a pair of carbon electrodes 30 made of graphite. One of the carbon electrodes 30 includes an upper electrode 31 and a lower electrode 32 of types shown in FIG. 2. An inner diameter of a through hole 35 is 10 mm, and a diameter of a bolt 36 is 6 mm.

Polycrystalline silicons 6 and 8 having diameters of about 120 mm were grown from vapor phase on the silicon core 5 within a temperature range of 900° C. to 1100° C., and then the upper electrode 31 was moved 1.5 mm in a direction to increase space of a polycrystalline silicon rod. Breaks were detected at two points after the U rod was sheared.

Example 2

Polycrystalline silicon was grown from vapor phase under the same condition as Example 1 except that one of carbon electrodes 30 includes an upper electrode 31 and a lower electrode 32 of types shown in FIG. 3. An inner diameter of a recess 38 is 82 mm, and an outer diameter of a protrusion 39 is 74 mm. After the vapor phase growth, the upper electrode 31 was moved 3.0 mm in a direction to reduce space of a polycrystalline silicon rod and warp a U rod outward. Breaks were detected at two points after the U rod was sheared.

Comparative Example 1

Polycrystalline silicon was grown from vapor phase under the same condition as Example 1 except that carbon electrodes 30 without movement of an electrode were used. Breaks were detected at five points after the U rod was sheared.

INDUSTRIAL APPLICABILITY

According to the present invention, a technique can be provided having a high effect of preventing occurrence of a crack or a break in a U rod that can be expanded and contracted in all directions during a vapor phase growth process of a polycrystalline silicon rod.

REFERENCE SIGNS LIST 1 base plate
2 metal electrode
3 gas nozzle
4 exhaust port
5 silicon core
5a vertical portion
5b bridge portion
6 straight body portion of polycrystalline silicon rod
8 bridge portion of polycrystalline silicon rod
10 reaction container
20 core holder
30 carbon electrode
31 upper electrode
32 lower electrode
33 upper surface of upper electrode 31
34 lower surface of upper electrode 31
35 through hole
36 bolt
37 washer
38, 42 recess
39, 41 protrusion
51, 52, 53 gap
100 apparatus for manufacturing polycrystalline silicon rod

The invention claimed is:

1. A carbon electrode comprising:
a lower electrode secured on a metal electrode that is an external electrode for electrifying a silicon core; and
an upper electrode located on the lower electrode, the upper electrode comprising an upper surface side, a lower surface side, and a securing portion of a core holder that holds the silicon core on the upper surface side,
wherein the upper electrode is slidable in all directions when the entirety of the lower surface side is in contact with an upper surface of the lower electrode, and
wherein the upper electrode comprises a hole extending from the upper surface side to the lower surface side, a lower end of a rod-shaped fastening member inserted into the hole is secured to the lower electrode, a diameter of the hole is larger than a diameter of a straight body portion of the rod-shaped fastening member, a gap is located between an inside of the hole and the straight body portion, and the upper electrode is slidable in all directions by an amount up to a width of the gap.

2. The carbon electrode according to claim 1, wherein the diameter of the hole is at least 1 mm larger than the diameter of the straight body portion.

3. The carbon electrode according to claim 1, wherein the upper electrode and the lower electrode comprise graphite.

4. The carbon electrode according to claim 1, wherein a coefficient of static friction of the contact surface between the upper electrode and the lower electrode is 0.3 or less.

5. An apparatus comprising a pair of metal electrodes, wherein electric power is supplied from the pair of metal electrodes to opposite ends of a silicon core assembled into an inverted U-shape to grow polycrystalline silicon from vapor phase on the silicon core,
wherein both opposite ends of the silicon core assembled into the inverted U-shape are respectively held by securing portions provided in carbon electrodes, and at least one of the carbon electrodes is the carbon electrode according to claim 1.

6. The carbon electrode according to claim 2, wherein:
the upper electrode and the lower electrode comprise graphite; and
a coefficient of static friction of the contact surface between the upper electrode and the lower electrode is 0.3 or less.

* * * * *